United States Patent
Hook et al.

(10) Patent No.: US 10,229,915 B2
(45) Date of Patent: Mar. 12, 2019

(54) MIRROR CONTACT CAPACITOR

(71) Applicant: International Business Machines Corporation, Armonk, NY (US)

(72) Inventors: Terence B. Hook, Jericho, VT (US); Joshua M. Rubin, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/838,496

(22) Filed: Dec. 12, 2017

(65) Prior Publication Data

US 2018/0102367 A1 Apr. 12, 2018

Related U.S. Application Data

(63) Continuation of application No. 15/192,121, filed on Jun. 24, 2016, now Pat. No. 9,881,925.

(51) Int. Cl.
  *H01L 27/10* (2006.01)
  *H01L 27/108* (2006.01)
  *H01L 29/06* (2006.01)

(52) U.S. Cl.
  CPC .... *H01L 27/10829* (2013.01); *H01L 27/1087* (2013.01); *H01L 27/10826* (2013.01); *H01L 27/10832* (2013.01); *H01L 27/10867* (2013.01); *H01L 27/10879* (2013.01); *H01L 29/0649* (2013.01)

(58) Field of Classification Search
  CPC ........... H01L 27/1203; H01L 27/10829; H01L 27/10826; H01L 27/10867; H01L 27/1087; H01L 27/10879
  See application file for complete search history.

(56) References Cited

U.S. PATENT DOCUMENTS

| | | | |
|---|---|---|---|
| 5,811,868 A | 9/1998 | Bertin et al. | |
| 5,841,182 A | 11/1998 | Linn et al. | |
| 6,373,127 B1 | 4/2002 | Baudouin et al. | |
| 7,473,979 B2 | 1/2009 | Clevenger et al. | |

(Continued)

OTHER PUBLICATIONS

List of IBM Patents or Patent Applications Treated as Related.

*Primary Examiner* — Nicholas J Tobergte
(74) *Attorney, Agent, or Firm* — Fleit Gibbons Gutman Bongini Bianco PL; Thomas S. Grzesik (57) ABSTRACT

A semiconductor structure and a method for fabricating the same. The semiconductor structure includes a substrate and a bonding layer in contact with a top surface of the substrate. At least one transistor contacts the bonding layer. The transistor includes at least one gate structure disposed on and in contact with a bottom surface of a semiconductor layer of the transistor. The semiconductor further includes a capacitor disposed adjacent to the transistor. The capacitor contacts the semiconductor layer of the transistor and extends down into the substrate. The method includes forming at least one transistor and then flipping the transistor. After the transistor has been flipped, the transistor is bonded to a new substrate. An initial substrate of the transistor is removed to expose a semiconductor layer. A capacitor is formed adjacent to the transistor and contacts with the semiconductor layer. A contact node is formed adjacent to the capacitor.

20 Claims, 11 Drawing Sheets

(56) References Cited

U.S. PATENT DOCUMENTS

| | | |
|---|---|---|
| 8,361,875 B2 | 1/2013 | Zhu |
| 8,841,174 B1 | 9/2014 | Di Sarro et al. |
| 8,846,470 B2 | 9/2014 | Booth, Jr. et al. |
| 8,921,198 B2 | 12/2014 | Booth, Jr. et al. |
| 9,006,783 B2 | 4/2015 | Di Sarro et al. |
| 9,013,893 B2 * | 4/2015 | Hsu .................. H01L 23/49822 361/763 |
| 9,818,637 B2 * | 11/2017 | Stamper .............. H01L 21/6835 |
| 9,881,925 B2 * | 1/2018 | Hook ................ H01L 27/10829 |
| 2003/0122124 A1 * | 7/2003 | Nagano ............. H01L 21/76251 257/48 |
| 2008/0047743 A1 * | 2/2008 | Komatsu ............ H05B 41/2822 174/260 |
| 2010/0200949 A1 | 8/2010 | Booth, Jr. et al. |
| 2010/0230735 A1 | 9/2010 | Zhu |
| 2013/0178043 A1 * | 7/2013 | Cheng .................... H01L 21/84 438/400 |
| 2013/0248235 A1 * | 9/2013 | Hsu .................. H01L 23/49822 174/260 |
| 2013/0299897 A1 | 11/2013 | Doris et al. |
| 2018/0005873 A1 * | 1/2018 | Stamper .............. H01L 21/6835 |

\* cited by examiner

MIRROR CONTACT CAPACITOR

BACKGROUND OF THE INVENTION

The present invention generally relates to the field of semiconductors, and more particularly relates to trench capacitors.

Capacitors formed in three-dimensional trenches offer high capacitance per unit area. Typical applications include the storage capacitor for dynamic random access memory (RAM), and for power supply decoupling in high-performance processors. In some instances, these capacitors are formed in the substrate of the semiconductor.

SUMMARY OF THE INVENTION

In one embodiment, a method for forming a semiconductor structure is provided. The method comprises forming a transistor comprising at least a first substrate, a semiconductor layer formed on the first substrate, a source/drain region, one or more gate structures, and at least one device isolation region. The transistor is then flipped. After flipping the transistor, the transistor is bonded to a second substrate. At least the first substrate is then removed to exposed the semiconductor layer. A capacitor is formed adjacent to the flipped transistor and in contact with the semiconductor layer. The capacitor extends down into the second substrate. A contact node is formed adjacent to the capacitor and extends down into the second substrate.

In another embodiment, a semiconductor structure is provided. The semiconductor structure comprises at least a substrate, a bonding layer, one or more transistors, and a capacitor. The bonding layer contacts a top surface of the substrate. The transistor contacts the bonding layer and comprises at least one gate structure disposed on and in contact with a bottom surface of a semiconductor layer of the transistor. The capacitor is disposed adjacent to the transistor and contacts the semiconductor layer of the transistor. The capacitor extends down into the substrate.

In a further embodiment, an integrated circuit is provided. The integrated circuit comprises a substrate, one or more transistors, a bonding layer in contact with a top surface of the substrate, and at least one capacitor. The transistor contacts the bonding layer and comprises at least one gate structure disposed on and in contact with a bottom surface of a semiconductor layer of the transistor. The capacitor is disposed adjacent to the transistor and contacts the semiconductor layer of the transistor. The capacitor extends down into the substrate.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
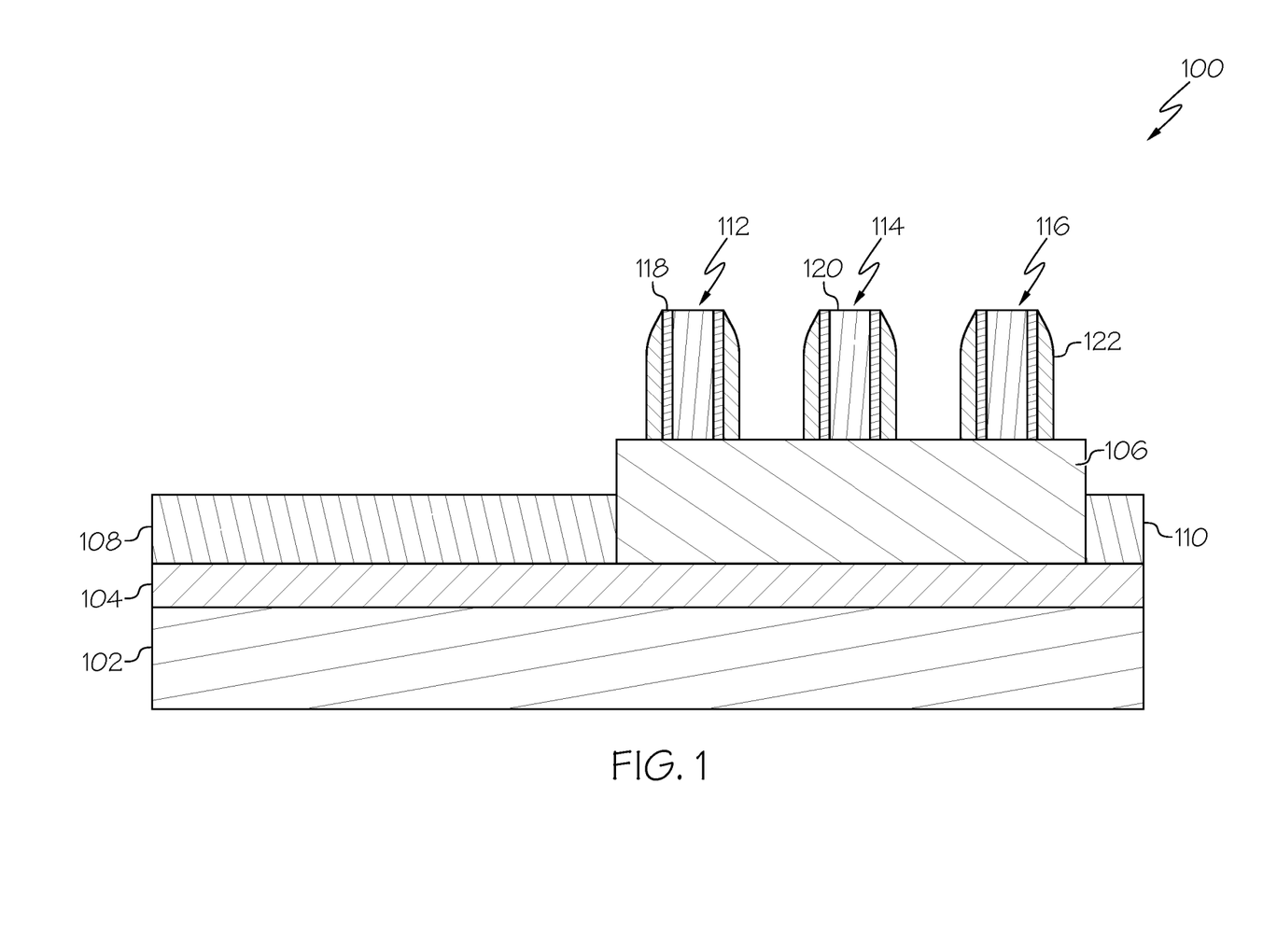
FIG. 1 is a cross-sectional view of a fin field-effect-transistor utilizing an initial semiconductor structure according to one embodiment of the present invention.

Referring now to the drawings in which like numerals represent the same of similar elements, FIGS. 1-9 illustrate various processes for fabricating a semiconductor structure comprising a trench capacitor such as a mirror contact embedded dynamic random-access memory (eDRAM). FIG. 1 shows a cross-section of a semiconductor structure 100 (also referred to herein as the "first semiconductor structure 100") at a starting point for embodiments of the present invention. For example, embodiments of the present invention begin after a field-effect-transistor (FET) has been fabricated and processed up through the front-end-of-the-line (FEOM) and a middle-of-line (MOL) stage, which includes forming of gate regions and a planarized dielectric layer. The semiconductor structure 100 of FIG. 1 comprises a substrate 102; a dielectric layer 104 (e.g., a BOX layer or oxide layer) overlying the substrate 102; one or more fin structures 106 in contact with the dielectric layer 104; device isolation regions 108, 110 such as shallow trench isolation regions; and source/drain regions (not shown in this cross-section).

The substrate 102 can be single crystalline and or a bulk substrate, a semiconductor-on-insulator (SOI) substrate, or a hybrid substrate. In some embodiments, the substrate comprises at least one of Si, Ge alloys, SiGe, GaAs, InAs, InP, SiCGe, SiC, and other III/V or II/VI compound semiconductors. The dielectric layer 104, in one embodiment, is a crystalline or non-crystalline oxide, nitride, oxynitride, or any other insulating material. The dielectric layer 104, in one embodiment, is a crystalline or non-crystalline oxide, nitride, oxynitride, or any other insulating material. The fin structure(s) 106 comprises a semiconductor material such as silicon (Si). The substrate layer 102 and the fin structure(s) 106 can be made of the same or different materials.

In one embodiment, prior to forming the fin structures 106 the semiconductor material/layer can be formed utilizing a layer transfer process including a bonding step, or an implantation process such as SIMOX (Separation by IMplantation of OXygen). This semiconductor layer can be undoped or doped with either p-type or n-type dopants through ion implantation, plasma doping, or gas phase doping. P-type transistors are produced by doping the semiconductor layer 106 with elements from group III of the periodic table (e.g., boron, aluminum, gallium, or indium). As an example, the dopant can be boron in a concentration ranging from $1 \times 10E18$ atoms/cm3 to $2 \times 10E21$ atoms/cm3. N-type transistors are produced by doping the semiconductor layer with elements from group V of the periodic table (e.g., phosphorus, antimony, or arsenic).

Fins are formed, in one embodiment, by forming an etch-stop capping layer onto the semiconductor layer through, for example, deposition. The etch-stop capping layer, in one embodiment, may be made of silicon-nitride although other material suitable in providing etch-stop function may be used as well. One or more fin structures are subsequently formed or etched out of the semiconductor layer to be on top of oxide layer 104 through a process involving masking, using industry-standard lithographic techniques, and directionally etching the etch-stop capping layer and underneath semiconductor layer. The directional etching process, such as a reactive-ion-etching (RIE) process, stops on the dielectric layer 104. After the RIE etching process, the photo-resist mask used in the lithographic etching process may be removed, leaving the fin structure(s) 106.

FIG. 1 also shows that one or more gate structures/stacks 112, 114, 116 are formed on and in contact with a top surface 118 of the fin structure 106. The gate structures 112, 114, 116 each comprise a gate dielectric 118 and a gate conductor 120. Gate spacers 122 surround and contact each of the gate structures 112, 114, 116. A gate first or a replacement metal gate (RMG) process can be used to form the gate structures 112, 114, 116. It should be noted that although FIG. 1 shows a non-planar semiconductor structure, embodiments are applicable to any type of structure such as planar FETs, vertical FETs, and/or the like.

Figure 2:
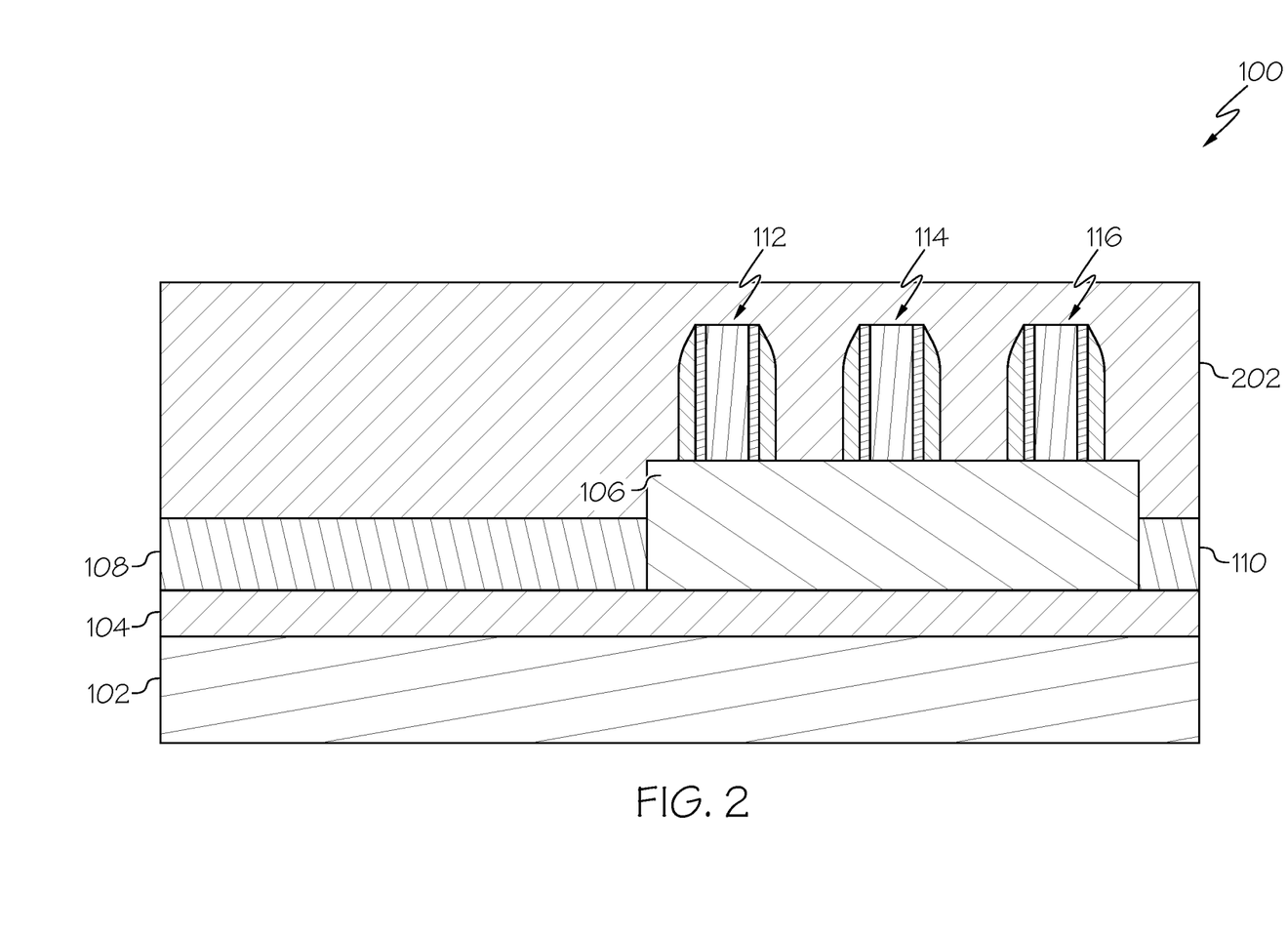
FIG. 2 is a cross-sectional view of the initial semiconductor structure after a dielectric layer has been formed thereon according to one embodiment of the present invention.

FIG. 2 shows that a planarization dielectric layer 202 is deposited over the fin(s) 106 including the gate structures and gate spacers, the source and drain regions, and the STI regions. In one embodiment, the planarization dielectric layer 202 is deposited by chemical vapor deposition or spin coating. For example, the planarization dielectric layer planarization dielectric layer 202 can include doped or undoped silicon oxide, silicon nitride, or a combination thereof. The planarization dielectric layer 202, in one embodiment, is formed as a self-planarizing layer, e.g., a spin-coated layer, or can be formed as a non-self-planarizing layer that is subsequently planarized, for example, by chemical mechanical planarization (CMP). A planar top surface of the planarization dielectric layer 202 is thus provided above, or at the top surface of the gate structures 112, 114, 116. In one embodiment, the planar topmost surface of the planarization dielectric layer 202 includes silicon oxide.

Figure 3:
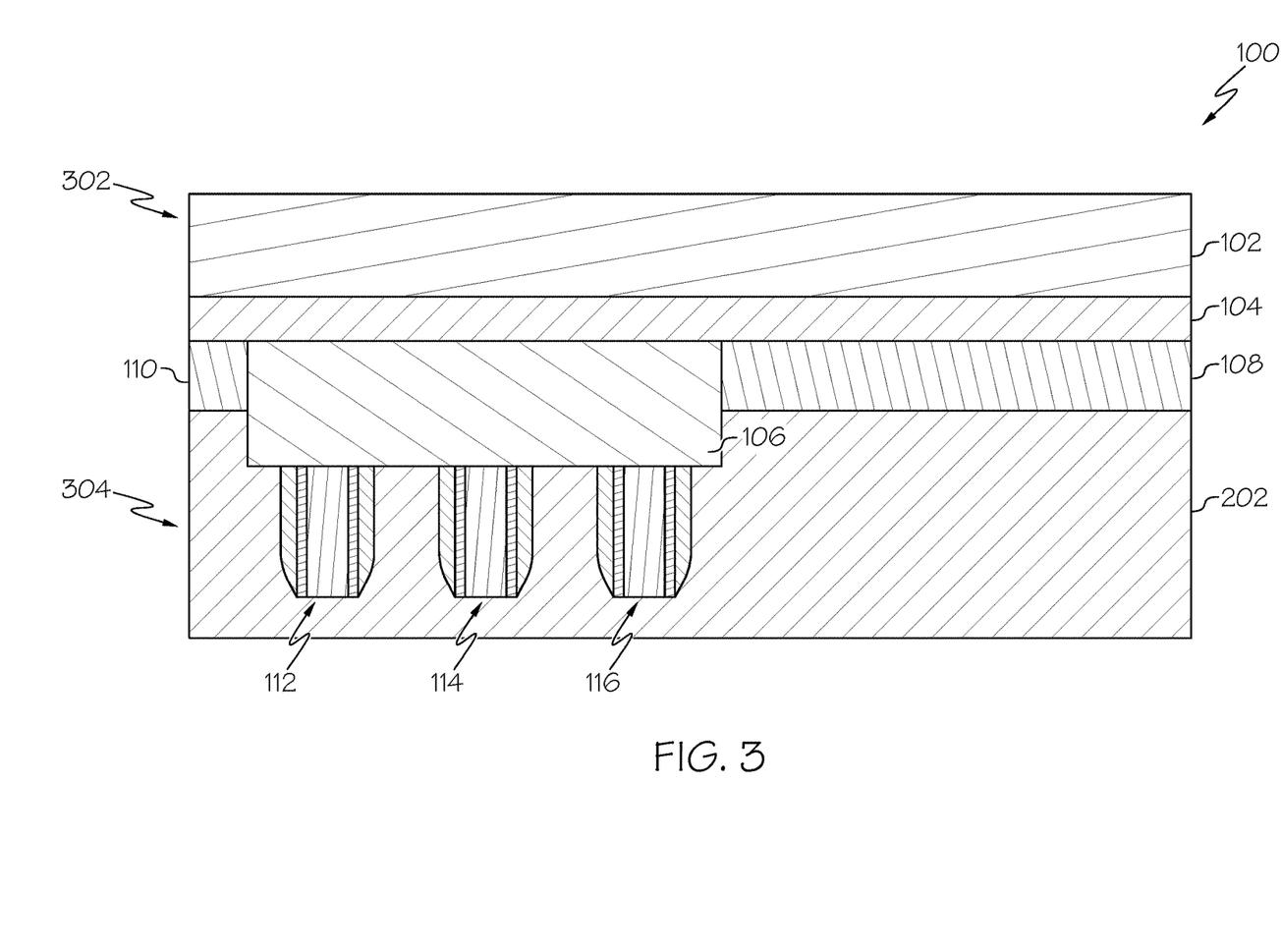
FIG. 3 is a cross-sectional view of the semiconductor structure of FIG. 2 after it has been rotated 180 degrees and bonded to a new handle substrate according to one embodiment of the present invention.
Figure 4:
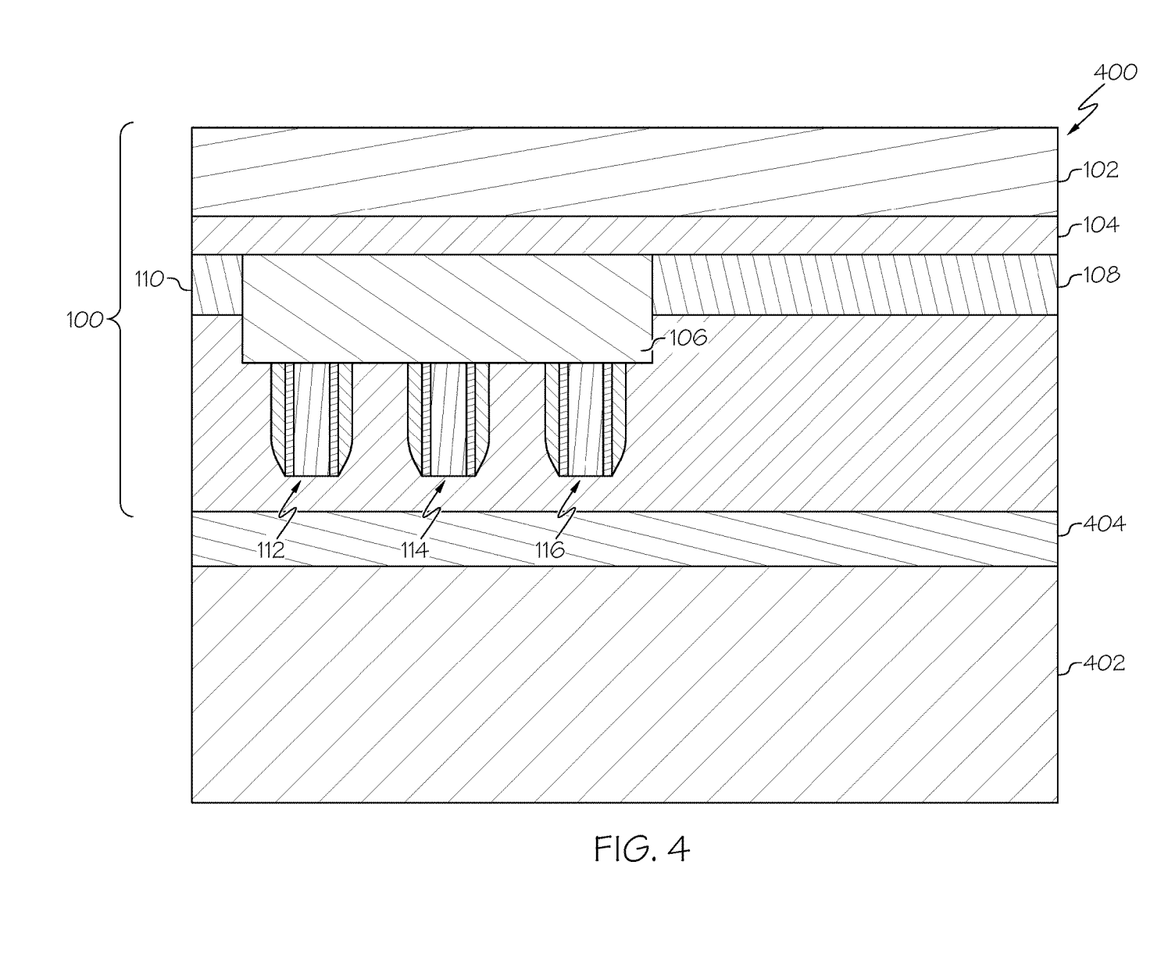
FIG. 4 is a cross-sectional view of the semiconductor structure of FIG. 3 after a dielectric layer has been formed therein according to one embodiment of the present invention.

The first semiconductor structure 100 is then flipped/rotated 180 degrees, as shown in FIG. 3. After rotation, the top layer 302 of the first semiconductor structure 100 comprises the original substrate 102, and the bottom layer 304 of the first semiconductor structure 100 comprises the dielectric layer 202 and. Bonding adhesive/film is then deposited onto the planarization dielectric layer 202 and/or to a new handle substrate. The bottom layer 304 of the first semiconductor structure 100 is then bonded to the new handle substrate 402 to form a second semiconductor structure 400, as shown in FIG. 4. The bonding adhesive/film 404, in one embodiment, is spin applied at approximately 500 to approximately 3000 rpm, soft-baked at between approximately 80° C. and approximately 120° C. and then cured at between approximately 300° C. and approximately 350° C. for up to an hour in nitrogen. However, other temperatures and methods for applying the adhesive/film 402 and bonding to the handle substrate 402 to the semiconductor structure 100 are applicable as well. The bonding adhesive 402 can be applied to the first semiconductor structure 100, the new handle substrate 402, or both.

The handle substrate 402, in one embodiment, includes a semiconductor material, or a conductive material, or a combination thereof. The thickness of the handle substrate 402 can be from 50 microns to 2 mm, although lesser and greater thicknesses can be employed as well. The first semiconductor structure 100 can be flipped upside down before, or after, being bonded to the handle substrate 402. In one embodiment, the handle substrate 302 is heavily doped either with p-type dopant atoms or with n-type dopant atoms to improve the capacitance and response of a subsequently formed capacitor. The dopant concentration of the handle substrate 402, in one embodiment, is from $1.0\times10^{15}/cm^3$ to $1.0\times10^{19}/cm^3$, although lesser and greater dopant concentrations are applicable as well.

Figure 5:
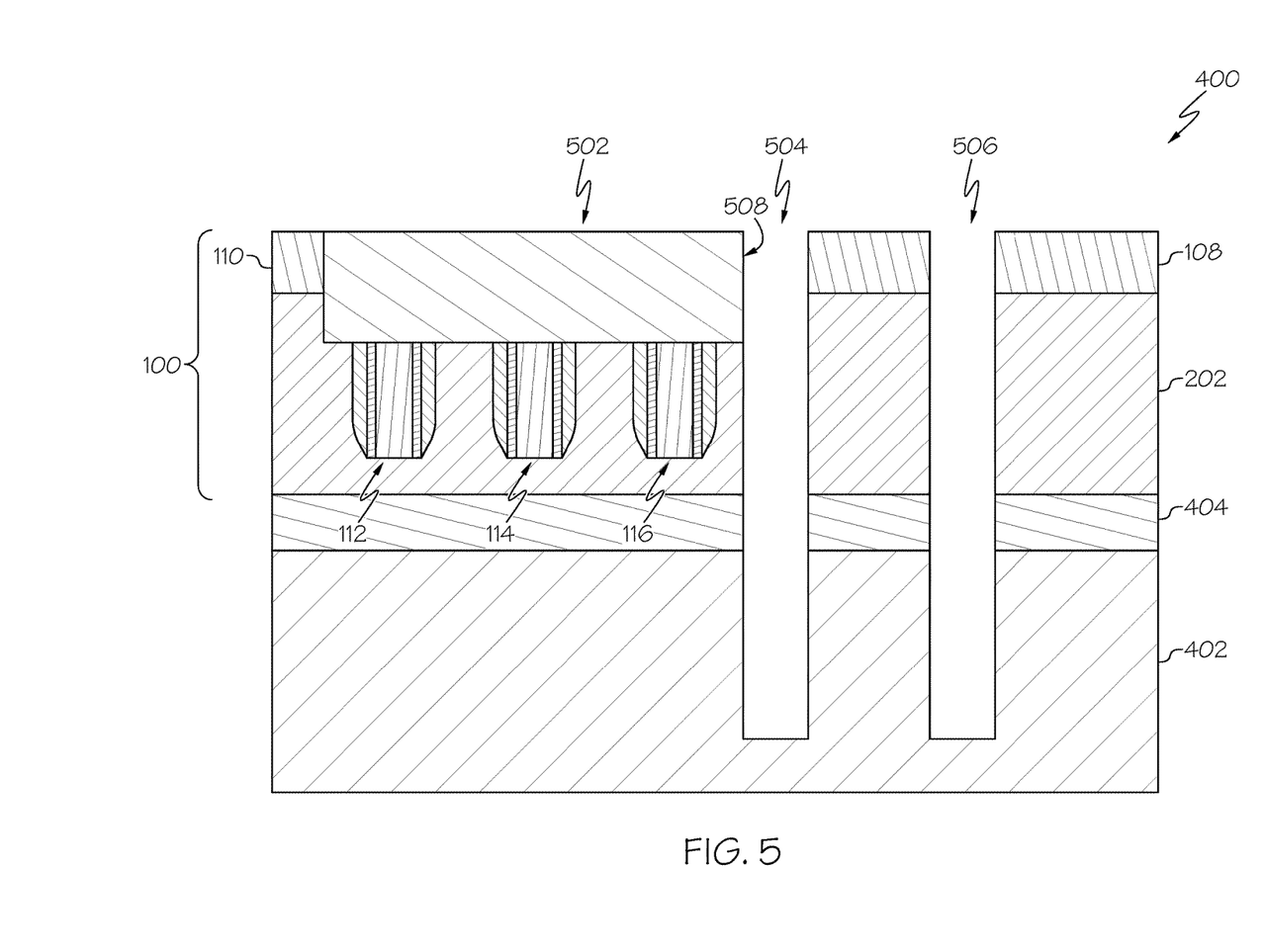
FIG. 5 is a cross-sectional view of the semiconductor structure of FIG. 4 after trenches have formed therein according to one embodiment of the present invention.

After the handle substrate 402 has been bonded to the first semiconductor structure 100, an etching, grinding, and/or polishing process(es) is performed to expose a bottom surface 502 of the fin(s) 106, as shown in FIG. 5. For example, in an embodiment where the structure 100 comprises a substrate 102 and a BOX layer 104, the original substrate 102 and the BOX layer 104 are removed to expose the fin 106. Deep trenches 504, 506 are then formed. In one embodiment, the trenches 504, 506 are formed by depositing a trench etch mask layer over and in contact with the STI regions 108, 110 and the substrate 102 of the first semiconductor structure 100. The trench etch mask layer is deposited by, for example, chemical vapor deposition (CVD). The trench etch mask layer, in one embodiment, includes doped or undoped silicon oxide, a dielectric metal oxide, a dielectric metal nitride, or a stack thereof. In one embodiment, the thickness of the trench etch mask layer is from 200 nm to 1,000 nm, although lesser and greater thicknesses can also be employed. The trench etch mask layer is able to be formed as a blanket material layer having a same thickness throughout. The material of the trench etch mask layer, in one embodiment, is selected to be different from STI regions 108, 110 and the first substrate 102.

A photoresist layer is then applied over the trench etch mask layer, and lithographically patterned to form openings therein. The locations of the openings are selected to correspond to the locations of where the deep trenches 504, 506 are to be subsequently formed through for a capacitor and a contact. For example, a first trench etch mask layer is formed over the semiconductor structure 100 in contact with the substrate 102 and is also formed over and in contact with the second STI region 110. A second trench etch mask layer is formed for over and in contact with a first portion of the first STI region 108. The third trench etch mask layer is formed over and in contact with a second portion of the first STI region 108. This processes leaves unmasked at least a first area of the structure 400 adjacent to the first semiconductor structure 100 for forming the first deep trench 504 and a second area of structure 400 adjacent to the first area for forming the second deep trench 506. The pattern in the photoresist layer can be transferred into the trench etch mask layer by an anisotropic etch.

The pattern in the trench etch mask layer is transferred into the semiconductor structure 400 by an anisotropic etch that employs the trench etch mask layer as an etch mask resulting in formation of the trenches 504, 506. The first trench 504, in which a capacitor will be subsequently formed, is formed through a first portion of the first STI region 108 adjacent to the first semiconductor structure 100 and exposing at least a portion of the sidewall 508 of the fin 106. The first trench 504 is further formed through the underlying planarized dielectric layer 202, the underlying bonding film 404, and into the handle substrate 402. The second trench 506, in which a contact node for the handle substrate 404 will be subsequently formed, is formed adjacent to the first deep trench 504 through a second portion of the first STI region 108, the underlying planarized dielectric layer 202, the underlying bonding film 404, and into the handle substrate 402. In one embodiment, trench depths from 5-20 micrometer are formed. However, other depths are applicable as well. The trench etch mask layer can be consumed partially or completely during the anisotropic etch that forms the first and second trenches 504, 506.

Figure 6:
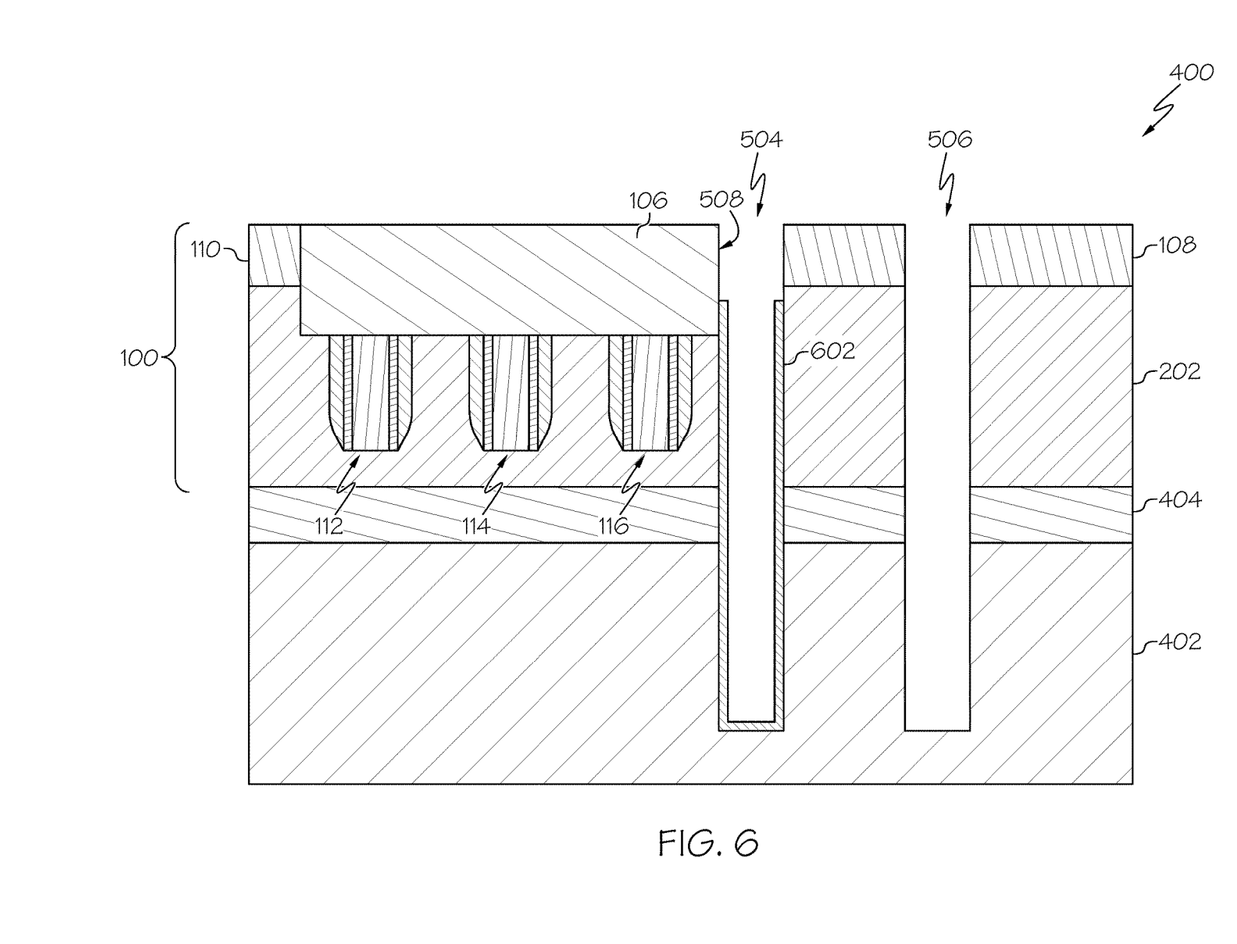
FIG. 6 is a cross-sectional view of the semiconductor structure of FIG. 5 after a dielectric layer has been formed within one of the trenches according to one embodiment of the present invention.

After the trenches 504, 506 have been formed, a dielectric layer 602 is formed within the first trench 504 conformally on and in contact with all physically exposed sidewalls and the bottom surface of the trench 504. The dielectric layer 602, in one embodiment, is formed by depositing a masking layer over the device and patterning the layer to have an opening exposing the first trench 504. Alternatively, a masking can be formed only over the second trench. In yet another embodiment, no masking layer is formed. A dielectric material is then deposited over the structure and within at least the first trench 504. The dielectric material can be deposited by methods known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The thickness of dielectric layer 602, in one embodiment, is in a range from 3 nm to 12 nm, although lesser and greater thicknesses can also be employed.

A disposable masking material such as a photoresist material is then applied into the first trench 504 after formation of the dielectric material. The disposable masking material is recessed to a height below the top surface of the trench 504. The physically exposed portions of the dielectric material are selectively removed from above the recessed surfaces of the disposable masking material and from within the second trench 506 if any dielectric material was deposited therein. Any remaining masking material can be removed, for example, by ashing. The resulting dielectric layer 602 comprises a top surface that is below the top surface of the first trench 504 and above a bottom surface of the fin 106. In other embodiments, the top surface of the dielectric layer 602 is below the bottom surface of the fin 106.

The dielectric layer 602 can include a dielectric metal oxide having a dielectric constant greater than 8.0, which is commonly known in the art as a high dielectric constant (high-k) dielectric material. Additionally or alternately, the dielectric layer 602 can include a dielectric silicate of at least one metallic element. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 7:
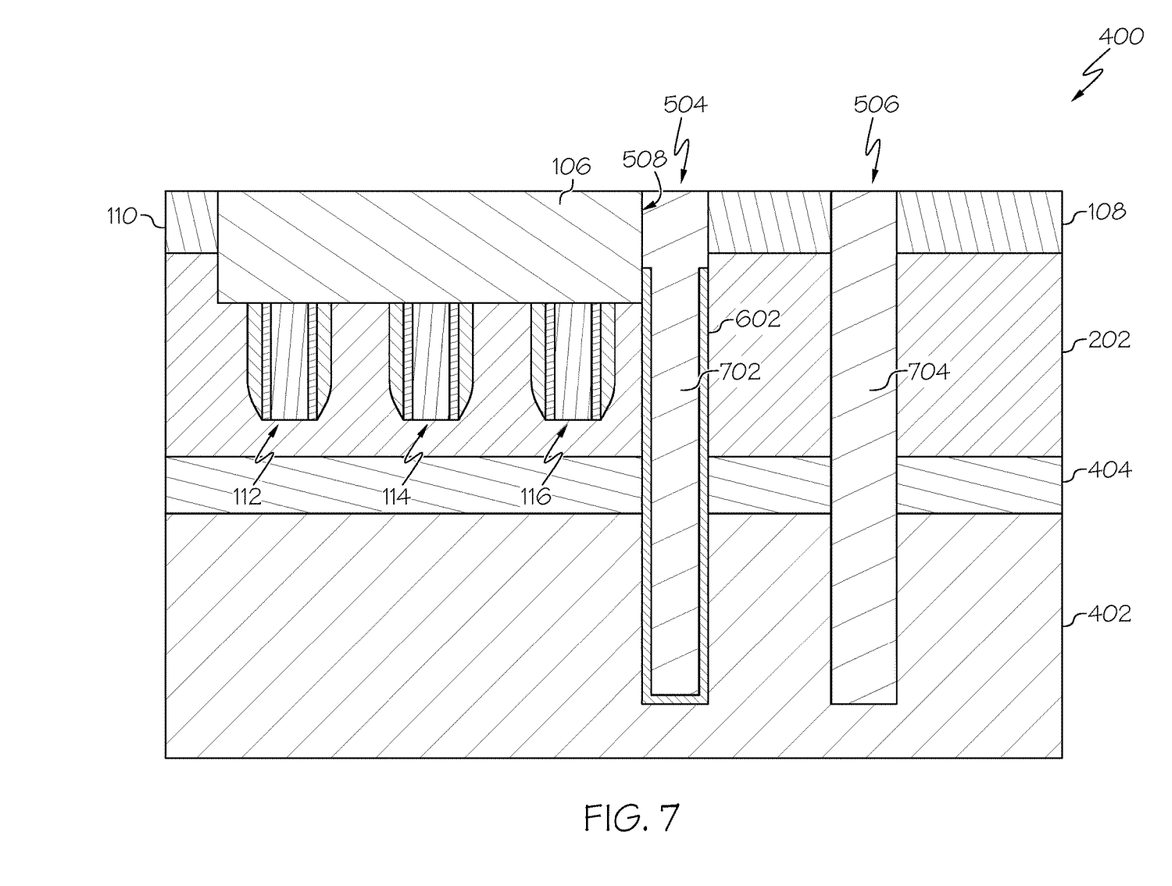
FIG. 7 is a cross-sectional view of the semiconductor structure of FIG. 6 after a conductive material layer has been formed in both trenches according to one embodiment of the present invention.

A conductive material layer 702, 704 is deposited within each of the trenches 504, 506 to completely fill the trenches 504, 506, as shown in FIG. 7. The conductive material layer 802 within the first trench 504 is deposited on and in contact with the exposed portions of the dielectric layer 602 within the first trench 504. The conductive material layer 702, 704 includes a conductive material, which can be a metallic material and/or a doped semiconductor material. The metallic material, in one embodiment, is an elemental metal such as tungsten, titanium, tantalum, copper, aluminum, or an alloy of at least two elemental metals, or a conductive metallic nitride of at least one metal, or a conductive metallic oxide of at least one metal. The doped semiconductor material, in one embodiment, is a doped elemental semiconductor material, a doped compound semiconductor material, or an alloy thereof. However, other materials are applicable as well.

In one embodiment, the conductive material layer 702, 704 is deposited by physical vapor deposition (PVD), chemical vapor deposition (CVD), electroplating, electroless plating, or a combination thereof. The conductive material layer 702, 704 is deposited to a thickness that is sufficient to completely fill the first and second trenches 504, 506. The portions of the conductive material layer 702, 704 above a horizontal plane including the top surface 502 of the fin 106 and a top surface 706 of the STI regions 108, 110, in one embodiment, are removed by chemical mechanical planarization (CMP), a recess etch, or a combination thereof. In one embodiment, the remaining portions of the conductive material layer 702, 704 are present only below the horizontal plane including the top surface 502 of the fin 106 and a top surface 706 of the STI regions 108, 110. It should be noted that the thermal cycles associated with the dielectric and node material fill processes are selected such that the transistors already in place are not adversely affected.

Figure 8:
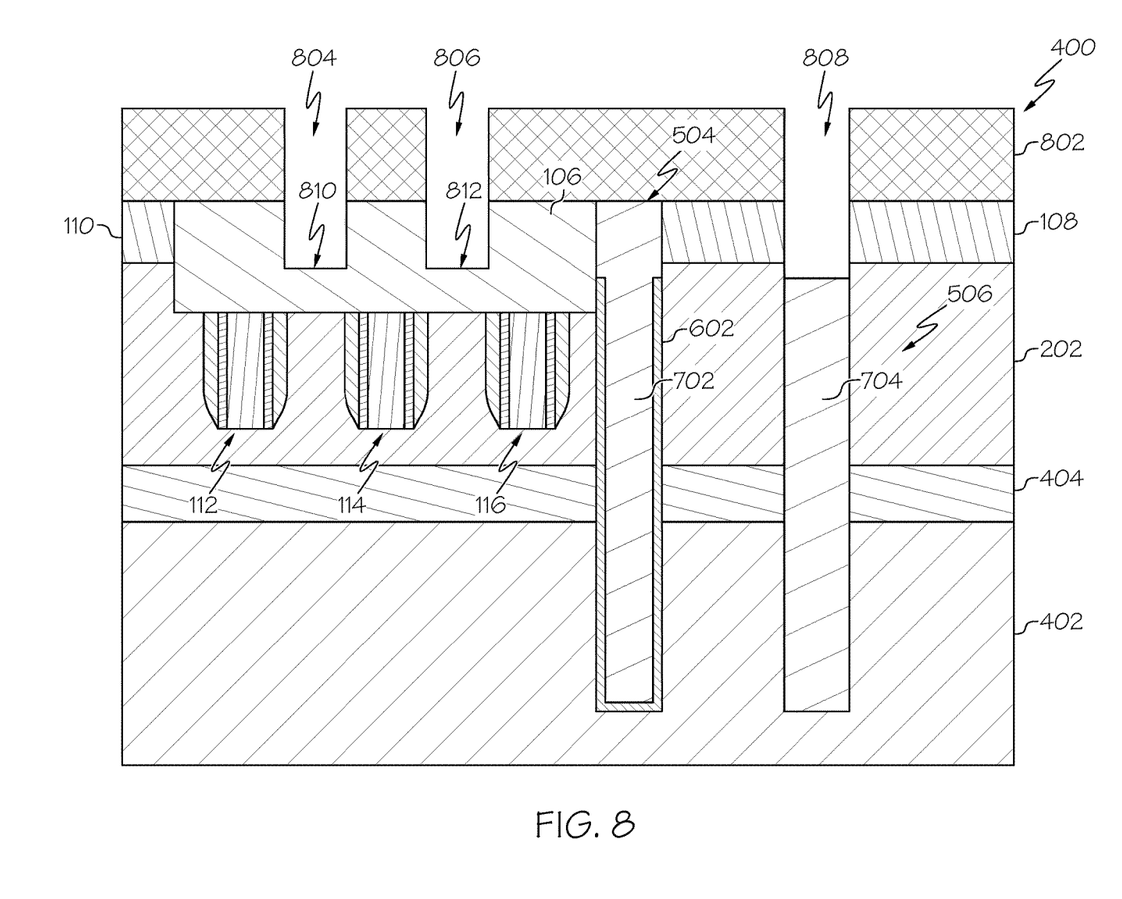
FIG. 8 is a cross-sectional view of the semiconductor structure of FIG. 7 after contact trenches have been formed for the source/drain regions and handle substrate according to one embodiment of the present invention.

FIG. 8 shows that after the conductive layer 702, 704 is formed within the trenches 504, 506, a layer of dielectric material 802 is then blanket deposited atop the entire structure 400. The blanket dielectric 802 may be a silicon-based material, such as SiO2, Si3N4, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-based materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

Figure 9:
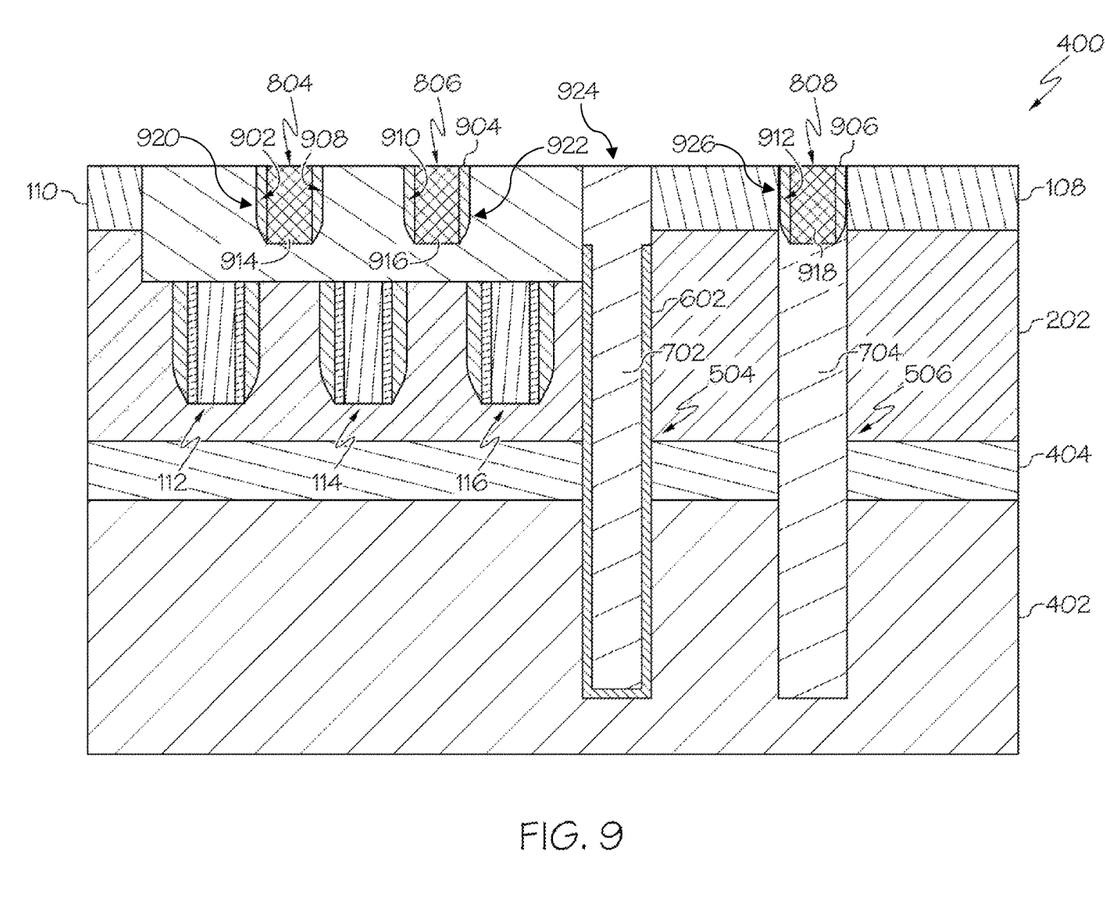
FIG. 9 is a cross-sectional view of the semiconductor structure of FIG. 8 after contacts have been formed in the contact trenches according to one embodiment of the present invention.

The deposited dielectric 802 is then patterned and an etch is performed to form first and second contact openings (vias/trenches) 804, 806 through the dielectric 802 and down into the fin 106 exposing a portion of the source/drain regions 810, 812. A third contact opening 808 is also formed through the dielectric 802 and into the conductive layer 704 of the second trench 506. A conformal contact liner material layer 902, 904, 906 is formed within each of the trenches 804, 806, 808, as shown in FIG. 9. In one embodiment, the conformal contact liner material layer 902, 904 contacts sidewalls 908, 910 of the exposed portions of the fin 106 and also contacts exposed portions of the source/drain regions 810, 812 within the first and second contact openings 804, 806. Within the third contact opening 808, the conformal contact liner material layer 906 contacts exposed sidewall portions 912 of the first STI region 108 and exposed portions of the conductive layer 704. In one embodiment, the contact liner layers 902, 904, 906 angle inwards from the top of the via 804, 806, 808 to the bottom of the vias.

The contact liner material layers 902, 904, 906, in one embodiments, include a conductive material that reduces contact resistance between contact conductors subsequently formed and source/drain regions. Exemplary conductive materials that can be employed as the contact liner material layer include, but are not limited to NiPt, Co, NiAl, and W. The contact liner material layers 902, 904, 906, in one embodiment, are formed utilizing a conventional deposition process including CVD or ALD. The thickness of the contact liner material layers 902, 904, 906, in one embodiment, is from 1 nm to 15 nm. However, other thicknesses are applicable as well. In one embodiment, the bottom portions of the contact liner material layer that are in contact with the source/drain regions 810, 812 react with the underlying material of the source/drain regions 810, 812 to form liner silicide portions 65. The liner silicide portions (not shown). The silicide portions reduce contact resistance between contact conductors subsequently formed and semiconductor materials of the source/drain regions 810, 812.

After the contact liner material layer 902, 904, 906 has been formed, remaining volumes of the contact openings 804, 806, 808 are filled with a contact conductor material layer 914, 916, 918. The contact conductor material layer 914, 916, 918, in one embodiment, includes a metal such as, for example, Cu, Al, W, Ti, Ta, or their alloys. The conductor material layer 914, 916, 918, in one embodiment, is formed by a conventional deposition process such as, for example, CVD, PVD, ALD, or plating. The contact conductor material layer 914, 916, 918 is deposited to a thickness so that a topmost surface of the contact conductor material layer 914, 916, 918 is located above or at the topmost surface of the contact level dielectric layer 902, 904, 906.

The blanker dielectric 802, portions of the contact liner material layer 902, 904, 906, and portions of the contact conductor material layer 914, 916, 918 that are located above the topmost surface of the contact liner material layer 902, 904, 906 are removed by employing a planarization process, such as, for example, CMP. The resulting structure comprises source/drain contacts 920, 922, a capacitor 924 such as an eDRAM cell capacitor, and a bulk contact 926.

Figure 10:
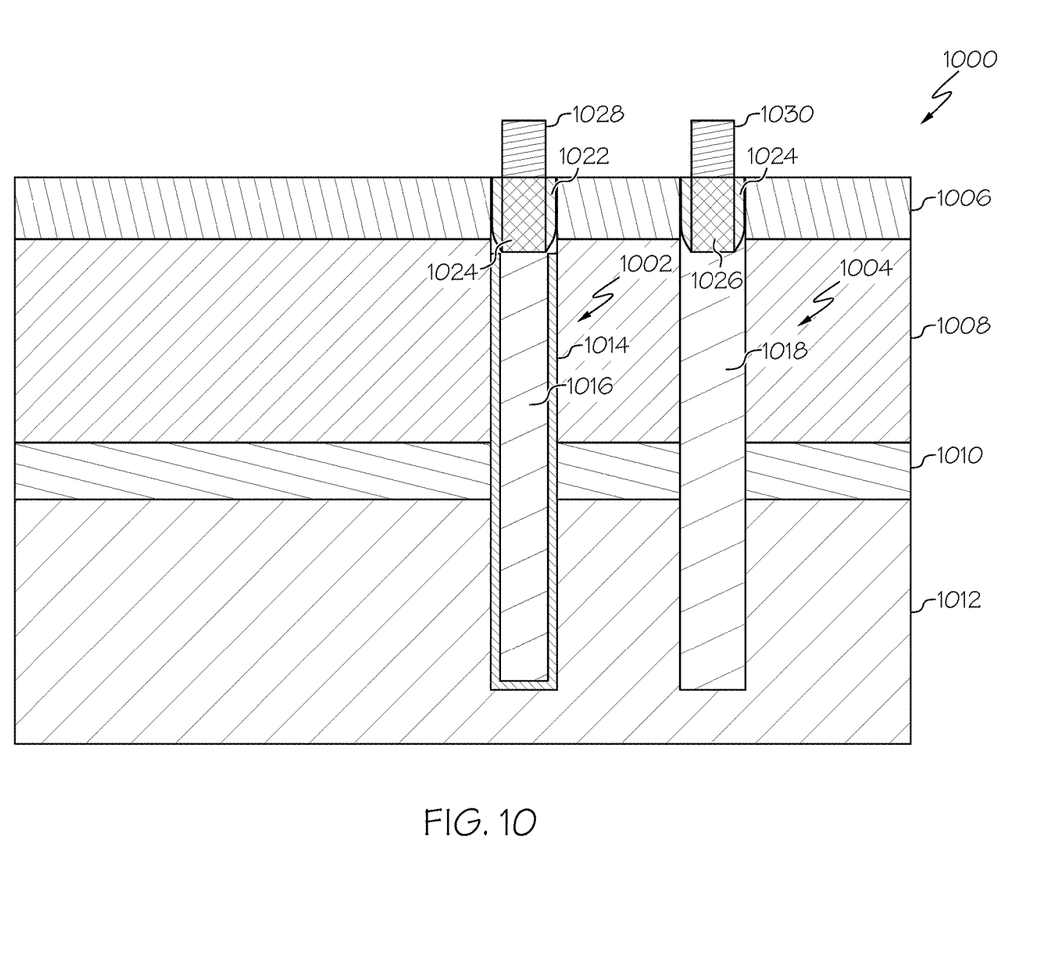
FIG. 10 is a cross-sectional view of decoupling capacitor structure according to one embodiment of the present invention.

In other embodiments, similar processing techniques are performed to form a decoupling capacitor 1000, as shown in FIG. 10. In this embodiment, the capacitor does not directly contact a finFEt as the capacitor shown in FIG. 9. For example, FIG. 10 shows trenches 1002, 1004 (similar to those of FIG. 5) formed through the STI layer 1006, the planarization dielectric layer 1008, bonding film(s) 1010, and down into the handle substrate 1012. A dielectric layer 1014 (similar to layer 602 of FIG. 6) is formed in the first trench 1002, and a conductive material layer 1016, 1018 is subsequently formed within both trenches as discussed above with respect to FIG. 7. A conductive material layer 1020, 1022 and a contact conductor material layer 1024, 1026 are then formed within each trench 1002, 1004 similar to that discussed above with respect to FIG. 9. The capacitor 1000, in one embodiment, is then coupled to an overlying wiring layer comprising, for example, a supply rail 1028 and a ground rail 1030.

Figure 11:
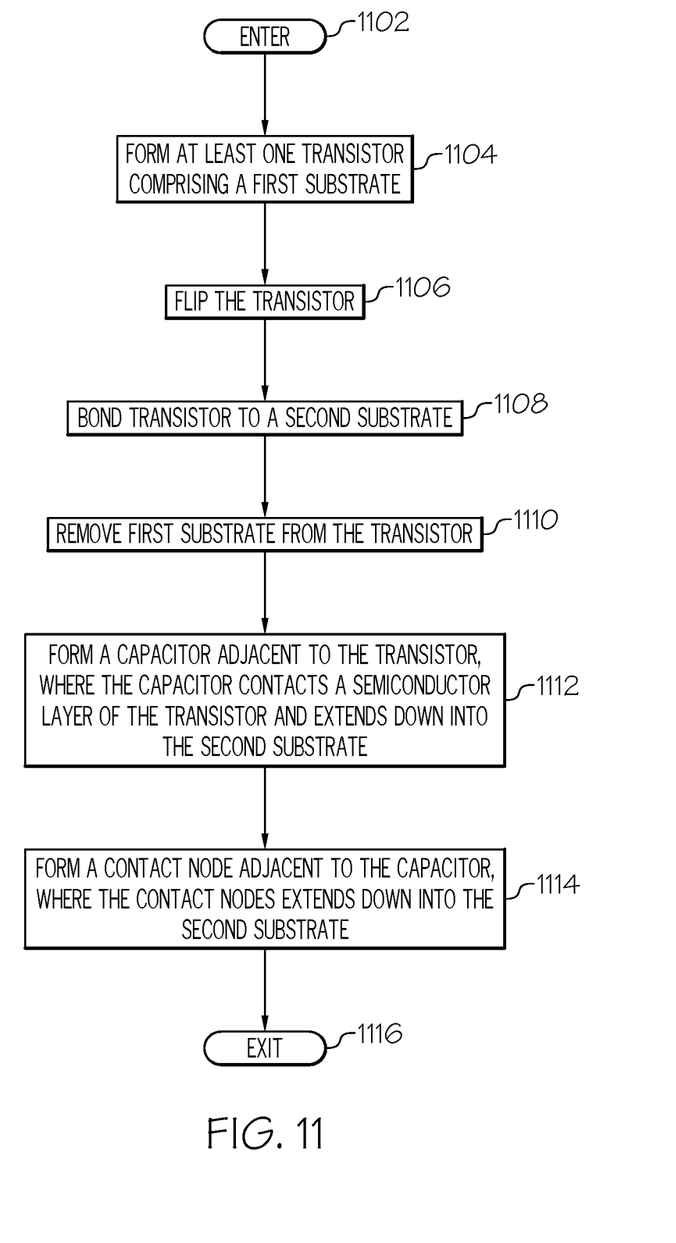
FIG. 11 is an operational flow diagram illustrating one process for forming a semiconductor structure comprising a trench capacitor according to one embodiment of the present invention.

FIG. 11 is an operational flow diagram illustrating one process for forming a semiconductor structure comprising a trench capacitor according to one embodiment of the present invention. In FIG. 11, the operational flow diagram begins at step 1102 and flows directly to step 1104. It should be noted that each of the steps shown in FIG. 11 have been discussed above with respect to FIGS. 1-10. At least one transistor is formed, at step 1104. The transistor comprises at least a first substrate, a semiconductor layer formed on the first substrate, a source/drain region, one or more gate structures, and at least one device isolation region. The transistor, at step 1106, is flipped/rotated.

After the transistor has been flipped, the transistor is bonded to a second substrate, at step 1108. At least the first substrate is removed, at step 1110. The removal of the at least first substrate exposes the semiconductor layer. A capacitor, a step 1112, is formed adjacent to the transistor and in contact with the semiconductor layer. The capacitor extends down into the second substrate. A contact node, at step 1114, is formed adjacent to the capacitor. The contact node extends down into the second substrate. The control flow exits at step 1116.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for fabricating a semiconductor structure, the method comprising:
   forming a semiconductor structure comprising at least a substrate, a bonding layer on and in contact with the substrate, a dielectric region on and in contact with the bonding layer, and a device isolation region on and in contact with the bonding layer;
   forming a decoupling capacitor extending down from the device isolation region into the substrate; and
   forming a contact node adjacent to the and capacitor, the contact node extending down from the device isolation region into the substrate.

2. The method of claim 1, wherein forming the decoupling capacitor comprises:
   forming a trench through the device isolation region and down into the substrate;
   forming a dielectric layer within the trench; and
   depositing a conductive material within the trench.

3. The method of claim 1, wherein forming the contact node comprises:
   forming a trench through the device isolation region and down into the substrate; and
   depositing a conductive material within the second trench.

4. The method of claim 1, further comprising:
   forming a first contact trench within the decoupling capacitor; and
   forming a second contact trench within the contact node.

5. The method of claim 4, further comprising:
   forming a first contact liner on sidewalls of first contact trench; and
   forming a second contact liner on sidewalls of the second contact trench.

6. The method of claim 5, further comprising:
   forming a contact conductor layer within each of the first trench contact trench and second contact trench after the first and second contact liners have been formed.

7. The method of claim 1, further comprising:
   coupling the decoupling capacitor to a supply rail; and
   coupling the contact node to a ground rail.

8. The method of claim 1, further comprising:
   prior to forming the decoupling capacitor and the contact node,
      forming one or more transistors comprising at least an additional substrate, a semiconductor layer formed on the additional substrate, a source/drain region, one or more gate structures, and a device isolation region;
      flipping the transistor;
      after flipping the transistor,
         bonding the transistor to the substrate; and
         removing at least the additional substrate.

9. A semiconductor structure comprising at least:
   a substrate;
   a bonding layer in contact with the substrate;
   a dielectric layer in contact with the bonding layer;
   a device isolation region in contact with the bonding layer; and
   a decoupling capacitor extending down from the device isolation region into the substrate.

10. The semiconductor structure of claim 9, wherein the decoupling capacitor comprises:
    a dielectric layer in contact with at least the substrate, bonding layer, and dielectric layer; and
    a conductive layer in contact with at least the dielectric layer.

11. The semiconductor structure of claim 10, wherein the decoupling capacitor further comprises:
    a contact layer in contact with the conductive layer of the decoupling capacitor.

12. The semiconductor structure of claim 11, wherein the decoupling capacitor further comprises:
    a contact liner in contact with the contact layer.

13. The semiconductor structure of claim 9, further comprising:
    a contact node disposed adjacent to the decoupling capacitor, the contact node extending down into the substrate, the contact node comprising a conductive layer.

14. The semiconductor structure of claim 13, wherein the contact node further comprises:
    a contact layer in contact with the conductive layer of the contact node.

15. The semiconductor structure of claim 14, wherein the contact node further comprises:
    a contact liner in contact with the contact layer.

16. An integrated circuit comprising:
one or more semiconductor structures, wherein at least one semiconductor structure comprises:
a substrate;
a bonding layer in contact with the substrate;
a dielectric layer in contact with the bonding layer;
a device isolation region in contact with the bonding layer; and
a decoupling capacitor extending down from the device isolation region into the substrate.

17. The integrated circuit of claim 16, wherein the decoupling capacitor comprises:
a dielectric layer in contact with at least the substrate, bonding layer, and dielectric layer;
a conductive layer in contact with at least the dielectric layer; and
a contact layer in contact with the conductive layer of the decoupling capacitor.

18. The integrated circuit of claim 17, wherein the decoupling capacitor further comprises:
a contact liner in contact with the contact layer.

19. The integrated circuit of claim 16, wherein the at least one semiconductor structure further comprises:
a contact node disposed adjacent to the decoupling capacitor, the contact node extending down into the substrate, the contact node comprising a conductive layer; and
a contact layer in contact with the conductive layer of the contact node.

20. The integrated circuit of claim 19, wherein the contact node further comprises:
a contact liner in contact with the contact layer.

* * * * *